(12) United States Patent
Wennemuth et al.

(10) Patent No.: US 6,768,191 B2  
(45) Date of Patent: Jul. 27, 2004

(54) ELECTRONIC COMPONENT WITH STACKED ELECTRONIC ELEMENTS

(75) Inventors: Ingo Wennemuth, Regensburg (DE); Jochen Thomas, Regensburg (DE)

(73) Assignee: Infineon Technologies AG, Munich (DE)

(*) Notice: Subject to any disclaimer, the term of this patent is extended or adjusted under 35 U.S.C. 154(b) by 30 days.

(21) Appl. No.: 10/217,185

(22) Filed: Aug. 12, 2002

(65) Prior Publication Data

US 2003/0030143 A1 Feb. 13, 2003

(30) Foreign Application Priority Data

Aug. 10, 2001 (DE) .......................................... 101 38 278

(51) Int. Cl.[7] .............................................. H01L 23/02
(52) U.S. Cl. ..................... 257/686; 257/685; 257/683
(58) Field of Search ............................... 257/686, 685, 257/693, 698, 700, 736, 737, 738, 741, 750

(56) References Cited

U.S. PATENT DOCUMENTS

| 5,394,303 A | 2/1995 | Yamaji |
| 6,028,365 A | 2/2000 | Akram et al. |
| 6,080,931 A | 6/2000 | Park et al. |
| 6,137,164 A | 10/2000 | Yew et al. |

FOREIGN PATENT DOCUMENTS

| DE | 198 45 316 C2 | 12/1999 |
| JP | 3-109490 | 5/1991 |
| JP | 10 242 379 A | 9/1998 |
| JP | 2000 114 449 A | 4/2000 |
| TW | 359863 A | 6/1999 |
| WO | WO 00/67314 | 11/2000 |

OTHER PUBLICATIONS

Anonymous: "Stepped pyramid chip stack structure for increased silicon circuit density for a given die footprint", *Research Disclosure RD413088–A*, Sep. 10, 1998.

*Primary Examiner*—Eddie Lee  
*Assistant Examiner*—Douglas W. Owens  
(74) *Attorney, Agent, or Firm*—Laurence A. Greenberg; Werner H. Stemer; Ralph E. Locher

(57) ABSTRACT

An electronic component includes stacked electronic elements with external contacts. The external contacts are connected to contact terminal pads of an interconnect layer disposed on an isolating body. This isolating body extends over underlying side edges of a further electronic element, and its interconnect layer is connected to another interconnect layer of the stack via its external contact surfaces.

18 Claims, 6 Drawing Sheets

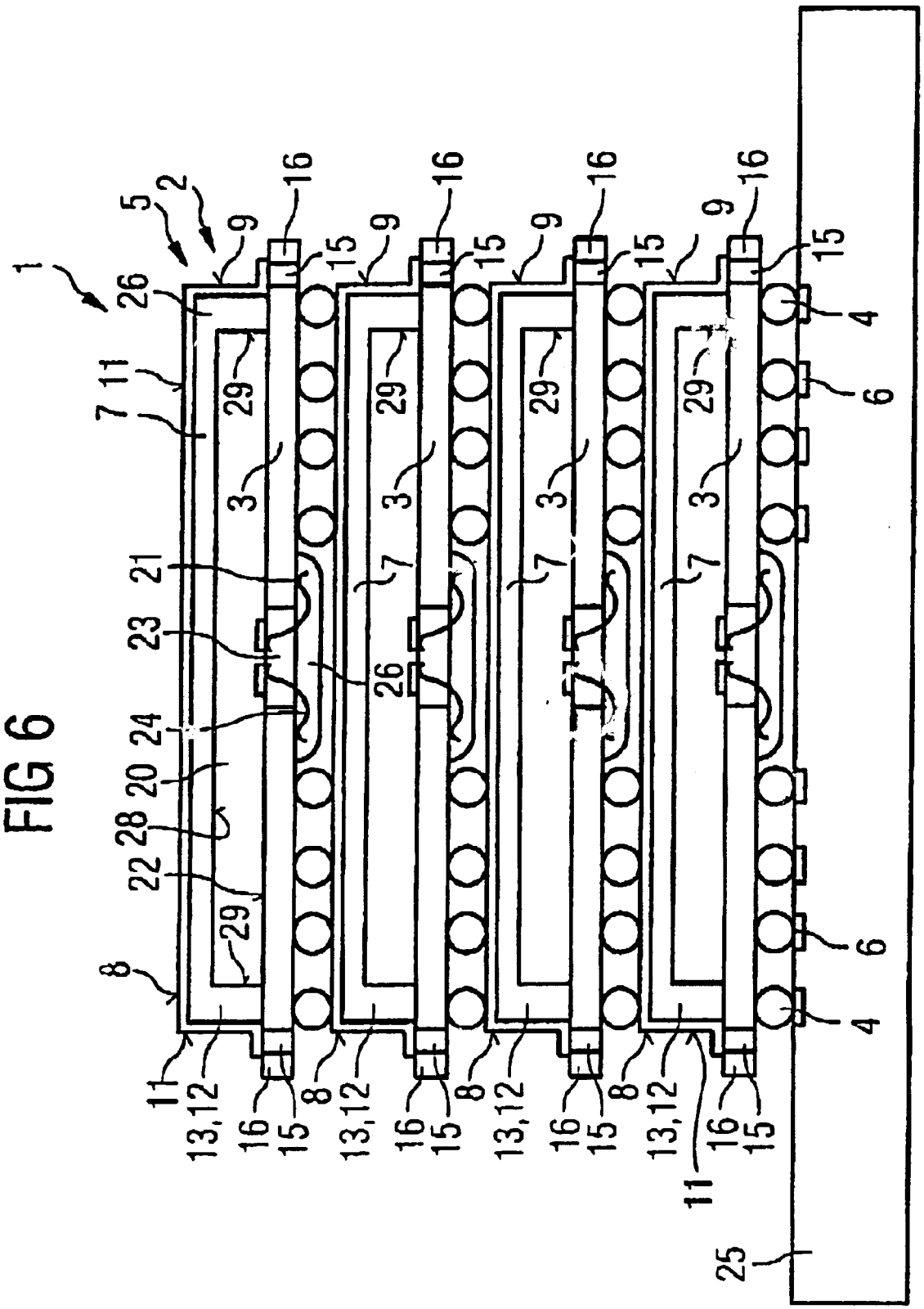

ELECTRONIC COMPONENT WITH STACKED ELECTRONIC ELEMENTS

BACKGROUND OF THE INVENTION

Field of the Invention

The present invention relates to an electronic component with stacked electronic elements and to methods of fabricating electronic components with stacked electronic elements.

Conventional techniques for stacking electronic elements are not based on FBGA (Fine Pitch Ball Grid Array) housings and there exists no satisfactory solution for stacking electronic elements with semiconductor chips in FBGA (Fine Pitch Ball Grid Array) housings. Additional problems result from the complications caused by the small raster dimension of the external contacts, and the two-dimensional external contact distribution of the FBGA style.

SUMMARY OF THE INVENTION

It is accordingly an object of the invention to provide an electronic component with stacked electronic elements and methods for fabricating such electronic components which overcome the above-mentioned disadvantages of the heretofore-known components and methods of this general type and which allow the use of stacked elements with FBGA housings. The component should be inexpensive and easy to manufacture. Furthermore, the individual stacked elements should be replaceable at any time.

With the foregoing and other objects in view there is provided, in accordance with the invention, an electronic component, including:

electronic elements stacked on top of one another, the electronic elements including a topmost electronic element and a further electronic element disposed below the topmost electronic element;
each of the electronic elements having side edges and each of the electronic elements including a rewiring body with external contacts distributed thereon;
an isolating body;
an interconnect layer disposed on the isolating body, the interconnect layer having contact terminal pads;
the external contacts of the rewiring body of the topmost electronic element being connected to the contact terminal pads of the interconnect layer;
the interconnect layer extending over the side edges of one of the topmost electronic element and the further electronic element;
a further interconnect layer neighboring the interconnect layer, the interconnect layer and the further interconnect layer being detachably connected to one another; and
the further interconnect layer having contact terminal pads electrically connected to at least a respective further one of the electronic elements via the external contacts of the respective further one of the electronic elements.

In other words, the electronic component according to the invention includes stacked electronic elements, each of which includes a rewiring body with external contacts distributed on it. The external contacts of the topmost element are connected to contact terminal pads of a structured interconnect layer that is disposed on an isolating body. The interconnect layer extends over the underlying side edges of the top element or of another electronic element and is detachably connected to a subsequent interconnect layer of the stack. A subsequent interconnect layer is electrically connected by way of its contact terminal pads to at least one other electronic element by way of external contacts of this other electronic element. The advantage of this embodiment is that each element represents an individual element installed on the isolating body with an interconnect layer, which can be connected to the interconnect layers of similar elements at any time. The number of elements in an electronic component with stacked elements is thus unlimited. At the same time, the edge region of the isolating body with the structured interconnect layer can be bent in order to move it past the side edge of an element, thereby achieving a high elasticity and flexibility, which simplifies the stacking of the electronic elements. Furthermore, the stacked FBGA housing itself can be identical to the standard FBGA housing for non-stacked applications.

In another embodiment of the invention, the interconnect layer is disposed on a flexible plastic carrier which serves as the isolating body. Such a flexible plastic carrier has the advantage that it can be bent in its edge regions in a relatively stress-free fashion without stressing the individual stacked elements, and so the conductive track of the interconnect layer can extend over underlying side edges of electronic components in order to make contact with the next component, which is disposed in turn on such a flexible plastic carrier.

Another embodiment of the invention provides that the isolating body be a self-supporting flexible isolating film. Like a flexible plastic carrier, films of this type can, without giving rise to high stresses, be injected in the electronic element and bent around the side edges of an element so that contact can be made between the interconnect layer and the subsequent interconnect layers of the stack with corresponding additional electronic elements. If an electronic element should become defective, the flexible isolating film with its interconnect coating can be separated from the next element, i.e. the next isolating film, without a large technical expenditure, and a replacement element with a preformed interconnect layer can be inserted. To accomplish this, the interconnect layer on the flexible isolating film is bent around the side edges of an underlying element. Thus, after the bending, the external contact surfaces in the bent edge region of the interconnect layer are available on the bottom side, which can be placed directly on the topside of the next interconnect layer.

While the isolating body is preferably an isolating film, the rewiring body on the active topside of a semiconductor chip of an electronic element can be formed from a rewiring layer, a rewiring film or a rewiring plate.

In another embodiment of the invention, the rewiring body includes a bonding channel in its center, which includes contact surfaces of the active topside of the semiconductor chip. Bond connections are laid from the contact surfaces of the semiconductor chip to corresponding contact terminal pads in the rewiring plane of the rewiring body. From there, rewiring lines lead to the individual external contact surfaces of the rewiring body which bear the external contacts. These external contacts are distributed two-dimensionally on the rewiring plane of the rewiring body and correspond to corresponding contact terminal pads on the interconnect layer of the isolating body.

On their part, the interconnect layers of each electronic element include external contact surfaces in their edge regions, which are connectible to contact terminal pads of an additional interconnect layer in a stacked fashion. These external contact surfaces produce the connection to the next electronic element of the stack of electronic elements and are disposed on the bent edge regions of the interconnect layer. The top or outermost interconnect layer with its external contacts comes to the bottom side after the bending and can be connected to an underlying element by way of its interconnect layer.

In another embodiment of the invention, the packing density of the stack is increased in that isolating bodies with a double-sided coating of structured interconnect layers, for instance double-sided copper-laminated flexible conductive tracks, are utilized. After the bending of the edge regions, the bottom interconnect layer of the isolating body which is equipped on both sides lies on the top surface of the isolating body and is connected to the next interconnect layer of one of the next electronic elements by way of additional feedthroughs in the bent edge region.

In another embodiment of the invention, it is provided that the external contact surfaces include contact bumps or solder balls on the bent edge regions of the interconnect layers. These solder balls or contact bumps on the conductive track coating in the region of the bent edge of the isolating body can be connected to the corresponding contact terminal pads of the underlying interconnect layer of the next electronic element. Both the solder balls and the contact bumps of the interconnect layers lie in the same plane as the solder balls or contact bumps of the next electronic element.

In another embodiment of the invention, the external contact surfaces on the bent edge regions can include solderable coatings and can then be joined directly to contact terminal pads of an underlying interconnect layer. Compared to electrical and mechanical connections through the use of solder balls or solder contacts, this embodiment of the invention has the advantage that a small coating thickness is sufficient for producing the elastic connections of the stack. In another embodiment of the invention, this type of solderable coating can include a silver solder coating on the external contact surfaces in the bent edge region of the interconnect layer. Silver solder coatings such as this have the advantage of an extremely low electrical resistance and form only silver sulfite in the atmosphere, which is still electrically conductive.

In another embodiment of the invention, the conductive track and the isolating plate together can form a flexible printed circuit board, which is flexible when bending the edge regions and which can be subsequently thermoset into a stable PCB (Printed Circuit Board) with bent edge regions. A PCB such as this being formed initially of flexible material which is then thermoset has the advantage that, after the thermosetting process, the component being formed of stacked elements forms a stable structure which needs no further support for dimensional stability.

In another embodiment of the invention, it is provided that the isolating body is simply an isolating layer which is applied directly onto the plastic molding compound of an FBGA housing as an isolating body. In this embodiment, the isolating layer is disposed on the top surface of the plastic molding compound, on one hand, and is additionally arranged on the side edges of the plastic molding compound and compensates unevennesses of the plastic molding compound, so that a formfitting interconnect layer can be installed on this isolating body which is included of an isolating layer. The advantage of this embodiment of the invention is that it can be realized extremely compact and only slightly increases the outer dimensions of an electronic element for accepting the isolating coating and the interconnect layer.

The interconnect layer can also be arranged directly on the isolating external surfaces of a plastic molding compound of a housing of an electronic element. In this case, the housing differs from the standard FBGA housings in that a structured metal laminate is visible on the topside of the plastic molding compound. This metal laminate can be provided with a solder resist wherever there are no contact terminal pads or external contact surfaces to be kept clear.

In another embodiment of the invention, the interconnect layer is laid not only over the edges of the plastic molding compound but also over the edges of the rewiring body, so that the rewiring plane of the rewiring body can be connected directly to the interconnect layer.

According to another embodiment of the invention, the rewiring body includes feedthroughs in its edge region, with which the external contact surfaces of the interconnect layer on the plastic molding compound and on the edges of the housing communicate, so that the electrical connection to the rewiring plane of the rewiring body can be laid by way of these feedthroughs. In this embodiment of the invention, a correspondingly prepared element can be advantageously stacked onto another, whereby the stacking sequence is unrestricted. Besides this, the stackable elements can be utilized as single elements at any time. Additional external contacts are provided for stacking in the edge region of the rewiring body, which contacts correspond to the feedthroughs in the edge region of the rewiring body. Thus, signal currents and supply powers can be switched through from the bottommost to the topmost of the stacked electronic elements.

Depending on the construction of the stacked electronic elements according to the invention, external contacts of the electronic elements and contact bumps for the conductive tracks are installed in a common step or in separate steps. The assembly of the electronic elements can also occur before or after the bending of the edge regions of the interconnect layer on an isolating carrier. But this is not true of an embodiment in which the conductive track is applied directly on the plastic molding compound of a housing of an electronic element. In this case, the electronic element must already be present so that it can be furnished with a corresponding interconnect layer on the outside of the housing. Thus, different variants of the method for fabricating the inventive electronic component with stacked electronic elements are possible.

With the objects of the invention in view there is also provided, a method for producing an electronic component with stacked electronic elements, the method includes the steps of:

producing a flexible isolating body with an interconnect layer having contact terminal pads at positions corresponding to external contacts distributed on a rewiring body of an electronic element, the flexible isolating body including external contact surfaces disposed in edge regions of the flexible isolating body;

cutting off corner regions and/or edge regions of the flexible isolating body that have no external contacts disposed therein;

bending remaining edge regions of the flexible isolating body for providing a bent isolating body such that the external contact surfaces are disposed on a bottom side of the bent isolating body;

curing the bent isolating body;

installing the electronic element including the rewiring body with the external contacts on the contact terminal pads of the interconnect layer; and stacking isolating bodies with electronic elements installed thereon on one another for forming the electronic component with the stacked electronic elements.

In other words, one of the methods for fabricating an electronic component with stacked electronic elements, each having a rewiring body with external contacts distributed on it, includes the following steps:

fabricate a flexible isolating body with an interconnect layer, whereby the interconnect layer includes contact terminal pads whose positions correspond to the external contacts of an element, and whereby the isolating body includes external contact surfaces which are disposed in the edge regions of the isolating body;
separate corner regions and/or edge regions of the isolating body which lack external contacts;
bend the remaining edge regions of the flexible isolating body so that the external contact surfaces are arranged on the bottom of the bent flexible isolating body;
cure the isolating body;
install an electronic element with its external contacts on the contact terminal pads of the interconnect layer; and
stack the isolating bodies with electronic elements and external contacts on one another into an electronic component with stacked elements.

The advantage of this method is that an isolating body with bent edge regions is initially provided for each electronic element, which body bears an interconnect layer and includes contact terminal pads thereon, onto which an electronic element with its external contacts can be positioned or soldered. Even after the electronic element is soldered on, this element with the isolating body can also be employed as a single element for other applications. The advantage is that signal currents and electrical supply powers can now occur by way of surface-wide external contact surfaces of the interconnect layer, so that a primary object is achieved, namely to restructure the two-dimensionally configured external contacts of the electronic element of an FBGA housing into a contact configuration which still includes external contacts in the edge region.

With the objects of the invention in view there is also provided, a method for producing an electronic component with stacked electronic elements, the method includes the steps of:

packing a first electronic element to be stacked in a plastic molding compound;
installing a structured interconnect layer on a topside of the plastic molding compound and on edge sides of the plastic molding compound and on edge sides of a rewiring body having external contact surfaces distributed thereon, wherein the interconnect layer on the topside of the plastic molding compound includes contact terminal pads, and wherein conductive tracks of the interconnect layer on the edge sides of the rewiring body are connected to rewiring lines on a rewiring plane of the rewiring body;
installing external contacts on the external contact surfaces of the rewiring body;
applying a solder resist layer to a topside of the interconnect layer such that the contact terminal pads are left exposed; and
stacking electronic elements to form the electronic component by stacking at least a second electronic element such that external contacts of the second electronic element are placed on the contact terminal pads of the interconnect layer on the topside of the plastic molding compound of the first electronic element.

In other words, another method for fabricating an electronic component with stacked electronic elements, each of which includes a rewiring body with external contact surfaces distributed on it, includes the following steps:

pack a first electronic element that is to be stacked in a plastic molding compound;
place a structured interconnect layer on the top surface of the plastic molding compound and on the edges of the plastic molding compound and the rewiring body, whereby the interconnect layer on the top of the plastic molding compound includes contact surfaces; and whereby the conductive tracks of the interconnect layer on the edges of the rewiring body are connected to the rewiring lines on the rewiring plane of the rewiring body;
place external contacts on the external contact surfaces of the rewiring body;
apply a solder stop layer on the topside of the interconnect layer, leaving the contact terminal pads clear; and
stack electronic elements into an electronic component by placing at least one additional electronic element with its external contacts on the contact terminal pads of the interconnect layer on the top surface of the plastic molding compound of the first electronic element.

This fabrication method presumes that the electronic element is already in an FBGA housing, and that the plastic mass which surrounds the top surface and edges of a semiconductor chip of the electronic element represents the isolating body. The interconnect layer, which provides contact terminal pads on the topside of the plastic molding compound for accepting another element which may be stacked on this element, can be applied directly onto this type of isolating body. The edges of the electronic element, i.e. of the housing being formed of plastic molding compound, are likewise provided with the interconnect layer, so that the conductive tracks can be connected through to the rewiring plane of the rewiring body of the electronic element.

According to another method, owing to the critical junction region from the conductive tracks located in the edge regions to the rewiring line of the rewiring body, feedthroughs are first installed in the rewiring body in the edge region, which can then be contacted with the lines attached on the edges of the plastic compound.

With the objects of the invention in view there is also provided, a method for producing an electronic component with stacked electronic elements, the method includes the steps of:

forming feedthroughs in an edge region of a rewiring body such that the feedtroughs are connected to rewiring lines on the rewiring body;
packing a first electronic element to be stacked in a plastic molding compound and leaving the feedthroughs in the edge region of the rewiring body exposed;
applying a structured interconnect layer on a topside of the plastic molding compound and on edge sides of the plastic molding compound such that the interconnect layer on the topside of the plastic molding compound includes contact terminal pads and such that conductive tracks of the interconnect layer on the edge sides of the plastic molding compound are connected to the feedthroughs in the edge region of the rewiring body;
installing external contacts on external contact surfaces of the rewiring body;
applying a solder resist layer on a topside of the interconnect layer such that the contact terminal pads are left exposed; and stacking electronic elements to form the electronic component by stacking at least a second electronic element such that external contacts of the second electronic element are placed on contact terminal pads of the interconnect layer on the topside of the plastic molding compound of the first electronic element.

In other words, a method for fabricating an electronic component with stacked electronic elements, each of which includes a rewiring body with external contact surfaces distributed on it, includes the following steps:

install feedthroughs in the edge region of the rewiring body, which are connected to rewiring lines on the rewiring body;
pack a first electronic element that is to be stacked in a plastic molding compound, leaving the feedthroughs in the edge region of the rewiring body clear;
apply a structured interconnect layer on the topside of the plastic molding compound and on the edges of the plastic molding compound, whereby the interconnect layer on the top surface of the plastic molding compound includes contact terminal pads, and whereby the conductive tracks of the interconnect layer on the edges of the plastic molding compound are connected to the feedthroughs in the edge region of the rewiring body;
install external contacts on the external contact surfaces of the rewiring body;
apply a solder stop layer on the topside of the interconnect layer, leaving the contact terminal pads clear; and
stack electronic elements into an electronic component by placing at least one additional electronic element with its external contacts on the contact terminal pads of the interconnect layer on the top of the plastic molding compound of the first electronic element.

The foregoing three variants of the method are associated with the advantage that, on one hand, each electronic element can be utilized individually, and on the other hand, this electronic element can be stacked into a new electronic component with stacked elements without any limitation on the number of elements. The individual elements can be joined into an electronic component with stacked elements with the aid of conductive glue on the external contact surfaces of the interconnect layers. To accomplish this, a conductive glue is applied, which is provided with an electrically conductive filler and which bakes into the external contact surfaces of the interconnect layers under heat treatment.

Another technique for joining the elements that are to be stacked is soldering, with solderable coatings being applied to the external contact surfaces and then joined to one another in a corresponding soldering process. Besides this, according to another embodiment of the invention, the elements to be stacked are joined into an electronic component with stacked elements through the use of the soldering of solder balls or solder bumps on contact terminal pads of the interconnect layer of at least one additional element.

In sum, the stacking of semiconductor chips in FGBA housings requires a method for assembling electronic elements of this housing style vertically with a mechanical or electrical joining mechanism. This serves for increasing the integration density on given PCB surfaces, whereby individual elements are provided for stacking. DRAMs (Dynamic Raandom Access Memories) are a specific field of application of this invention. At present these memory chips are assembled predominantly in TSOP (Thin Small Outline Packages) housings, for which stacking can be performed according to the industrially applicable techniques. But more powerful memory chips with a higher data rate and a higher storage capacity, which place higher electrical and thermal requirements on the housings, are assembled in FBGA housings, for which there is still no available satisfactory solution for stacking techniques at the housing level.

Stacking chips inside a housing would require the fabrication of different chip sizes, which would mean deviating from the standard designs, for instance of DRAM chips. Other possibilities include enlarging the FBGA substrate, that is to say the rewiring body, in order to arrange the terminals required for stacking in the edge region. But this results in a higher consumption with respect to the FBGA substrate, which is relatively cost-intensive. On the other hand, more space is taken up on the PCB due to the external contacts that must be additionally provided on the edge of the substrate.

The invention can be realized in many modifications, a few of which will now be described in connection with the figures. The FBGA housing itself has a minimal space requirement and can therefore be borrowed from the single housing for non-stacked applications. The present method offers the possibility to utilize a standard FBGA housing as a basis for the stack housing. Furthermore, the present invention includes three methods for assembling and fabricating electronic components from stacked elements, whereby the component heights and assembly techniques are varied.

All electronic components that are produced by stacking electronic elements according to the present invention have the advantage that intensive cooling is possible, it being possible to employ the spacing between external contacts of these electronic elements for realizing cooling channels. According to one of the embodiments of the invention, the FGBA housing is soldered onto a pre-bent PCB with the aid of solder balls. In its initial condition this PCB is flexible; it is bent into the shape of a clamp after the interconnect layer, the solder resist layer, and potentially the solder balls and passive elements are completely coated and structured; and then it is fixed in this shape by a subsequent curing process.

The vertical assembling of the stack is accomplished with the aid of solder or glue joints between the clamp ends of the bent PCBs. On its part, this type of electronic component with stacked elements on bent PCBs can be fixed on a modular PCB by solder or glue joints at the bottom ends of the clamp with corresponding counterpoints on the modular PCB, that is to say on the PCB of one of the next planes.

Whereas, in a first variant of the invention, the bottommost electronic element can be positioned and directly contacted on the modular PCB, according to a second variant, the utilized module surface can be reduced in that the electronic elements are suspended on the bent PCBs with their contact terminals. Besides the glue joint and the solder joint between individual bent PCBs, solder balls can also be employed for joining the flexible PCBs to one another. Lastly, the integration density can be further increased by equipping the bent flexible PCBs on both sides, with the electronic elements mirroring one another on the PCB which serves as the isolating body, which is covered on both sides with an interconnect layer.

Besides this, an interconnect layer can be applied directly to the backside protection of an FBGA housing. In this variant of the invention, additional conductive tracks are placed on the backside protection, potentially by sputtering and then galvanizing, for instance while the semiconductor chips are still on a system carrier or laminate strips, or only after the individual housing being formed of plastic molding compound is separated. To accomplish this, the interconnect layer can be poured laterally onto the FBGA substrate (the rewiring body), or it can be realized by additional feedthroughs or vias through the edge of the rewiring body. The mechanical and electrical contact to the next electronic element (i.e. the next stack plane) is then brought about by a rewiring film which serves as the rewiring body (i.e. the FBGA substrate).

An extremely high storage density is thus achieved with this invention, while the standard package technology can be utilized throughout. A further advantage is that the number of stack planes—i.e. the number of stacked elements—is unlimited. Furthermore, the joint elements are materials which are known in semiconductor technology, and therefore a high reliability of the inventive stacking technique can be achieved. The stacking can occur with the aid of initially flexible PCBs as intermediate carriers for stacked electronic elements in an FBGA housing, or the backside of the housing can be utilized for the interconnect layer.

The known FBGA concept is thus retained, so that the existing storage density can be maintained without having to increase or enlarge the rewiring bodies. Furthermore, the memory densities are relatively variable, since the height of the stacked elements may be selectable according to the inventive design. Another advantage of the present invention is the airflow for cooling between the housings which is possible in any of the embodiments. Lastly, a high electrical conductivity of the stack elements and the electronic components with the stacked elements can be achieved with the aid of highly conductive PCB materials. In addition, the flexible and bent PCB offers a secure mechanical protection for the overall stack and directly protects the connection between external contacts of the electronic elements and contact terminal pads on the interconnect layer of the isolating body.

Other features which are considered as characteristic for the invention are set forth in the appended claims.

Although the invention is illustrated and described herein as embodied in an electronic component with stacked electronic elements and corresponding fabrication methods, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 6 is a diagrammatic cross-sectional view of a sixth embodiment of a component according to the invention.

DESCRIPTION OF THE PREFERRED EMBODIMENTS

Figure 1:
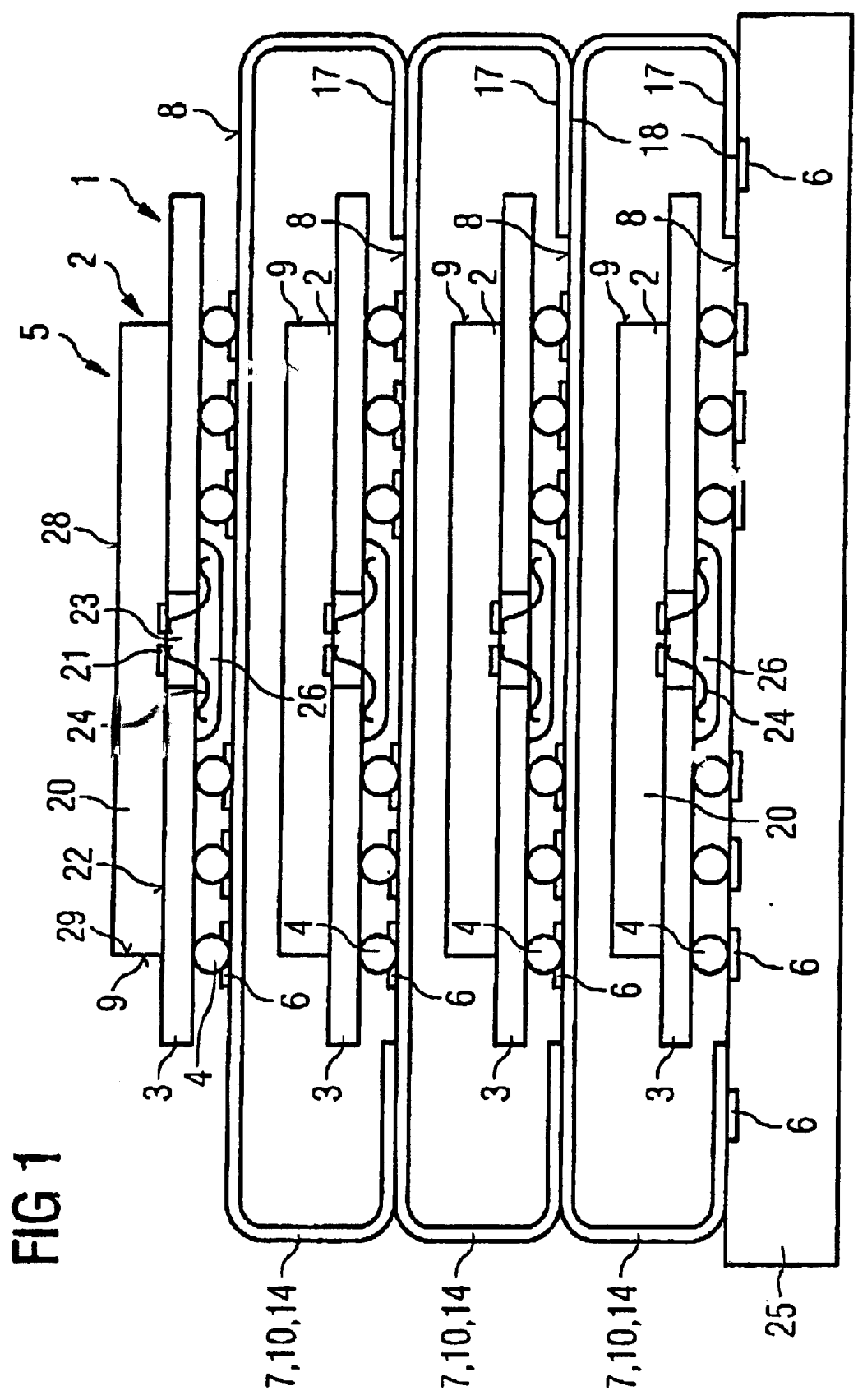
FIG. 1 is a diagrammatic cross-sectional view of a first embodiment of a component according to the invention.

Referring now to the figures of the drawings in detail and first, particularly, to FIG. 1 thereof, there is shown a diagrammatic cross-section of a first exemplifying embodiment. In FIG. 1, reference numeral 1 indicates an electronic component being formed of stacked electronic elements 1. The number 3 references a rewiring body on the active topside 22 of a semiconductor chip 20. The rewiring body 3 includes a bond channel 23 in which contact surfaces 21 of the active topside 22 of the semiconductor chip 20 are disposed. Leading from the contact surfaces 21 of the semiconductor chip 20 to the rewiring plane of the rewiring body 3 are bonding wires 24. This rewiring plane includes rewiring lines which belong to the external contacts 4 of the electronic element 1. In this embodiment of the invention according to FIG. 1, the external contacts 4 are connected to terminal pads 6 of a structured interconnect layer 8 on an isolating body 7. In this embodiment of the invention, this isolating body 7 is formed of a PCB material which is so flexible that the edge regions 17 of the interconnect layer 8 with the isolating body 7 can be bent, so that the interconnect layer 8 that was originally on top in the edge region of the isolating body 7 is now provided on the bottom. External contact surfaces 18 of the interconnect layer 8 are located in this bent edge region 17 of the interconnect layer 8, so that contact terminal pads on the next conductive track can be contacted with these external contact surfaces 18.

In the embodiment according to FIG. 1, three elements, including a topmost element 5, are thus placed on respective interconnect layers 8 with isolating bodies 7, while a fourth electronic element 1 is attached directly to a modular PCB 25, being positioned with its external contacts 4 directly on contact terminal pads 6 of the modular PCB 25. A stable construction is achieved with the aid of the flexible isolating body 7, which can be an isolating film 14, an isolating plate such as a plastic carrier 10, or an isolating layer, although a limited flexibility must exist for bending the isolating body 7. But this flexibility can be turned into a dimensional stability given a curing step for the curable or cross-linkable material of the isolating body 7, so that the electronic component 1 being formed of stacked elements 1 has a firmly fixed external contour.

A cooling stream can be conducted between the bent isolating body 7 with the interconnect layer 8 as the formed PCB and the electronic element 1, in order to cool the elements 1 in the stack. In this case, only two opposing side edges of the isolating body 7 are bent, so that the front surfaces of the electronic component 1 remain open to the airflow. The bond channel 23 is sealed with a plastic molding compound 26 for the purpose of protecting the bond connection and the topside of the electronic element in the region of the bond channel 23. The height of the cover over bond channel 23 is lower than the height of the external contacts 4 in order to guarantee a secure connection of the external contacts 4 to the contact terminals of the interconnect layer 8. On the other hand, the height of the plastic molding compound 26 on the bond channel 23 can ensure a limiting of the melting of the solder balls during the soldering of the electronic elements 1 to one another into a stack. Because each of the individual elements 1 includes a bent isolating body 7 with an identically structured interconnect layer, individual elements 1 from a stack can also be replaced during maintenance operations without much trouble. In order to ensure that the material of the external contacts 4 only wets the contact terminal pads 6 in the soldering of the external contacts 4 of the elements 1 onto the contact terminal pads 6 of the interconnect layer 8, this layer is also covered with a solder resist layer, from which only the contact terminal pads 6 on the topside of the interconnect layer 8 and the external contact surfaces 18 in the bent edge region of the conductive layer 8 (i.e. of the isolating body 7) are kept clear.

Figure 2:
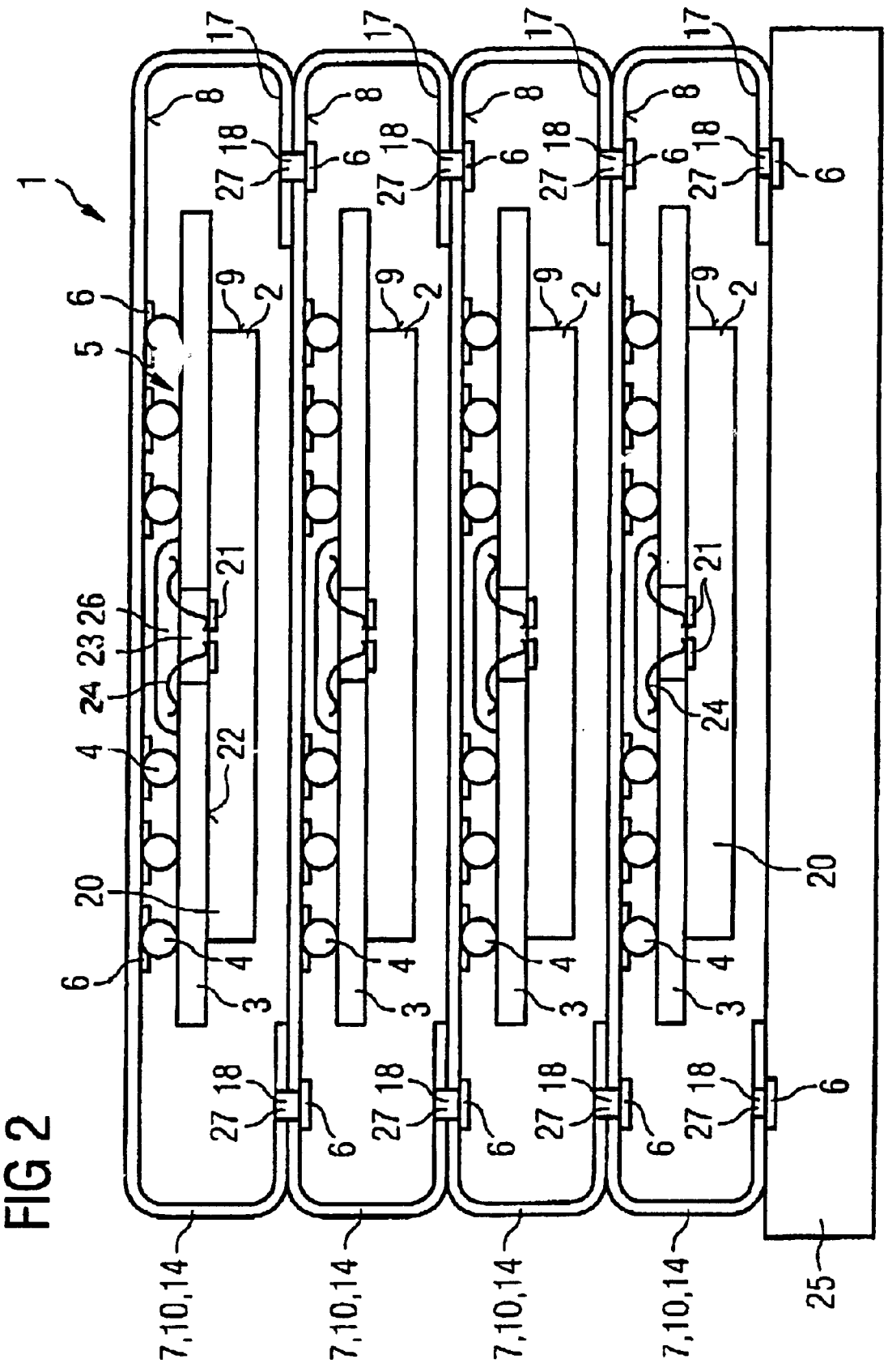
FIG. 2 is a diagrammatic cross-sectional view of a second embodiment of a component according to the invention.

FIG. 2 is a schematic cross-section representing a second embodiment of the invention. Components with the same functions as in FIG. 1 are given the same reference characters and are not described.

The second embodiment in FIG. 2 differs from the first embodiment in FIG. 1 in that the electronic elements 1 are arranged suspended on the isolating body 7 with bent edge regions. While in FIG. 1 the interconnect layer 8 is laid on the outside of the isolating body 7, in FIG. 2 the interconnect layer 8 is laid on the inside of the isolating body 7. The advantage of this is that, in corresponding embodiments, the metallic and structured interconnect layer 8 is protected. The electronic elements 1 are also completely surrounded by the isolating body 7 and thus protected. Besides this, none of the electronic elements 1 is arranged with its external contacts 4 on the modular PCB 25, which reduces the conductive track demand on the modular PCB 25. Another substantial difference between the first embodiment of FIG. 1 and the second embodiment of FIG. 2 is that the external contact surfaces 18 of the interconnect layer 8 lie on the inside of the isolating body 7. Feedthroughs 27 in the bent edge region provide the ability to make contact with the contact terminal pads 6 of the underlying interconnect layer 8 of the next underlying electronic element 1.

Figure 3:
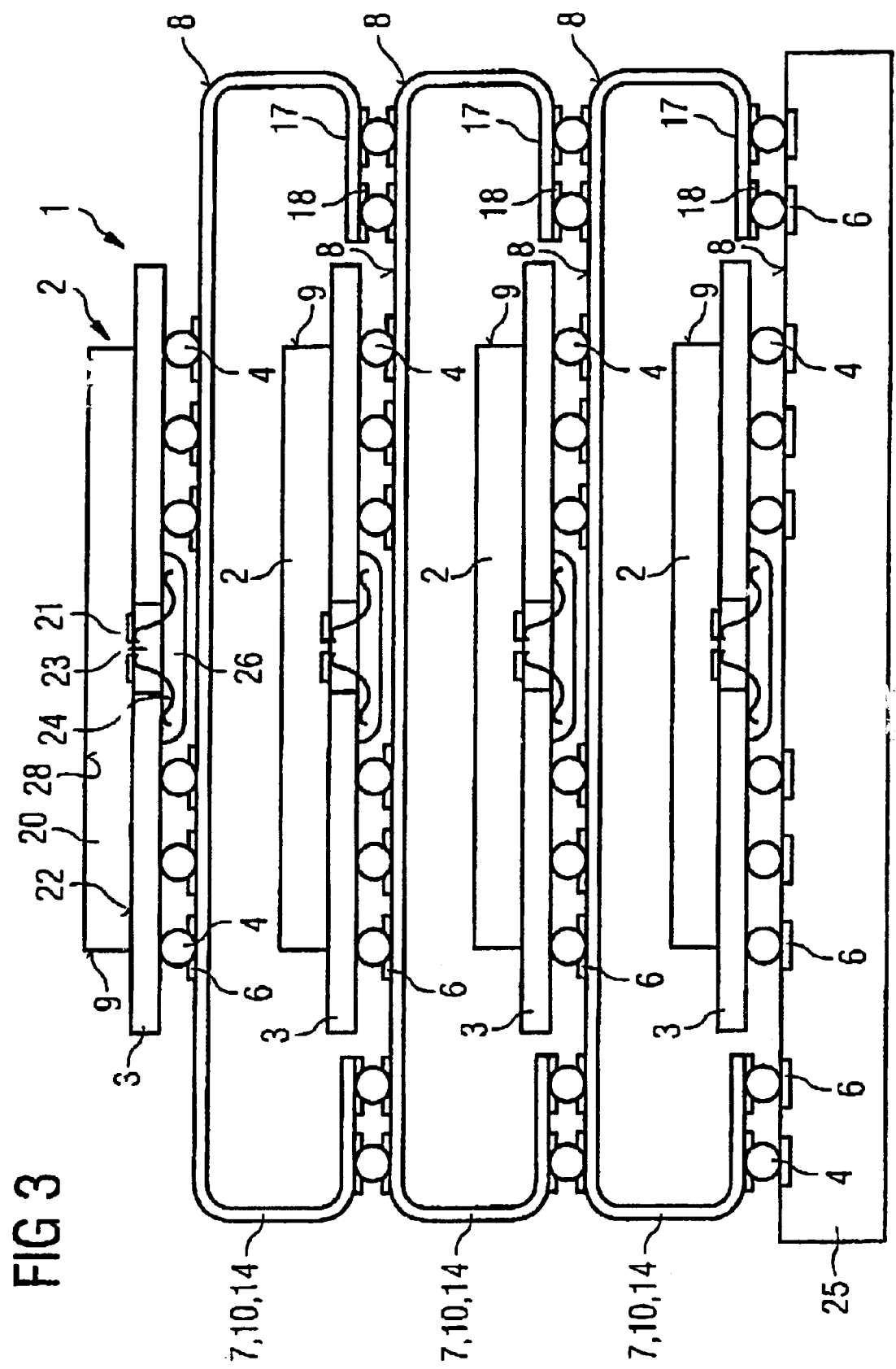
FIG. 3 is a diagrammatic cross-sectional view of a third embodiment of a component according to the invention.

FIG. 3 is a schematic cross-section representing a third embodiment of the invention. Components with the same functions as in the preceding figures are provided with the same reference characters and are not described.

The third embodiment of the invention in FIG. 3 differs from the preceding embodiments in that the connection of the external contact surfaces 18 in the bent edge region of the interconnect layer 8 includes solder balls or contact bumps 19 for connecting to the contact terminal pads 6 of the next interconnect layer 8, whose size corresponds to the size of the solder balls and contact bumps 19 of the external contacts of the electronic elements 1.

This third embodiment of the invention has the advantage over the first two embodiments that solder balls or contact bumps 19 can produce a highly reliable electrical and mechanical connection between the individual stacked electronic elements 1.

Figure 4:
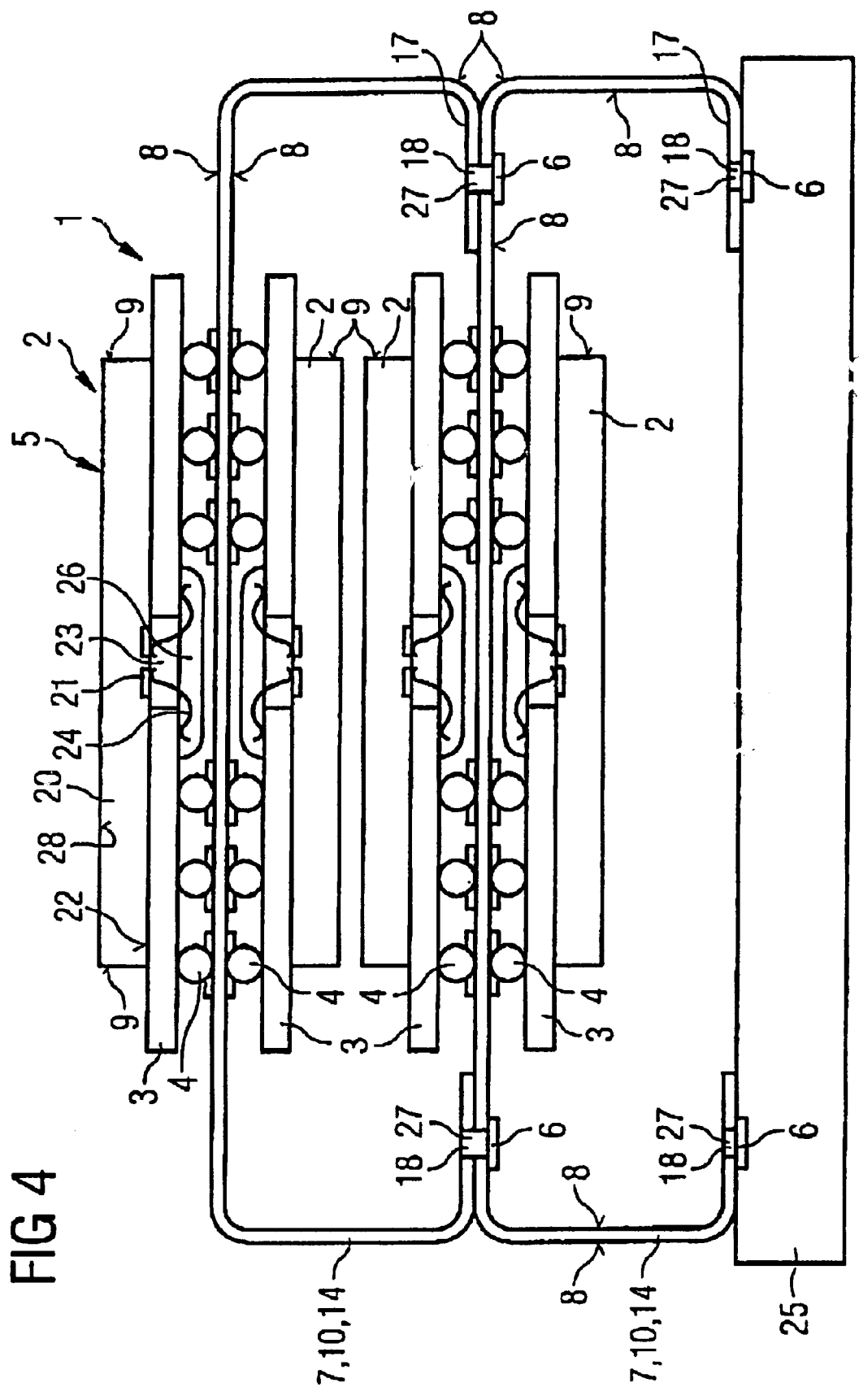
FIG. 4 is a diagrammatic cross-sectional view of a fourth embodiment of a component according to the invention.

FIG. 4 is a schematic cross-section of a fourth embodiment of the invention. Components with the same functions as in the foregoing figures are provided with the same reference characters and are not described.

The principal difference in the fourth embodiment compared to the foregoing embodiments is that a double-sided flexible isolating film 14 which is covered with interconnect layers 8 is employed as the isolating body 7. This isolating film 14 has the advantage that the packing density can be substantially increased in that the isolating body 7 can now be equipped on both sides. But the junction from one pair of electronic elements to another still occurs by way of feedthroughs 27 in the edge region 17 of the interconnect layer 8. Feedthroughs 27 are also required at the junction from the electronic component 1 with stacked elements 1 onto a modular PCB 25.

Figure 5:
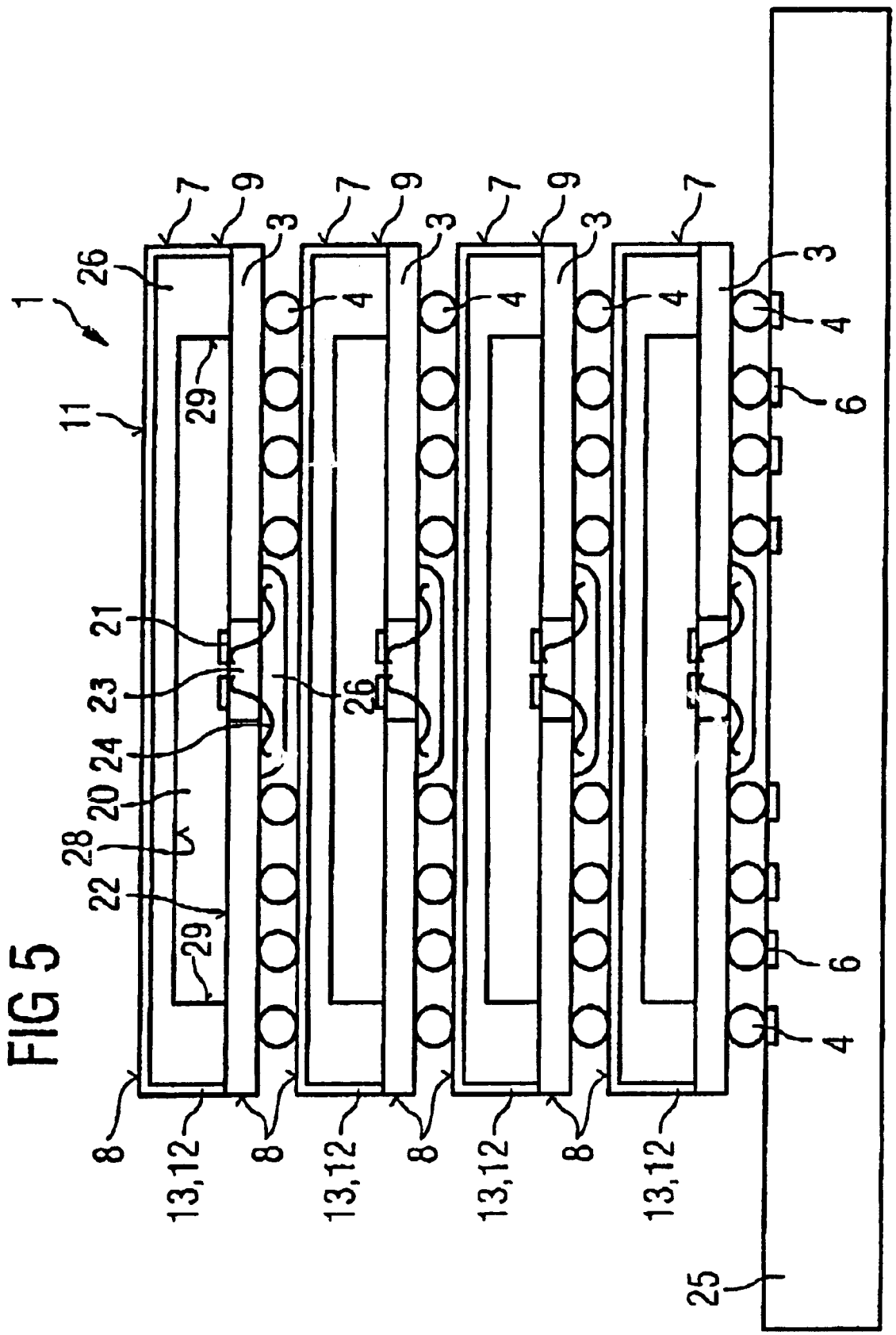
FIG. 5 is a diagrammatic cross-sectional view of a fifth embodiment of a component according to the invention.

FIG. 5 is a schematic cross-section of a fifth embodiment according to the invention. Components with the same functions as in the foregoing figures are provided with the same reference characters and are not described.

The fifth embodiment differs from the forgoing embodiments in that a plastic molding compound 12 is utilized as the isolating body 7 for protecting the backside 28 and the side edges or side walls 29 of the semiconductor chip 20 for the assembly, installation or deposition of a structured interconnect layer 8. The plastic molding compound 26 of an electronic element with the semiconductor chip is advantageously utilized for stacking the electronic elements 1. The junction from the backside of the housing 13 with the structured interconnect layer 8, which includes contact terminal pads 6 on the backside of the housing corresponding to the pattern of external contacts 4 on the rewiring body 3, is achieved by a structured interconnect layer 8 on the side edges of the plastic molding compound 12 of the housing and on the side edges of the rewiring body 3. The structured interconnect layer 8 thus surrounds each stacked electronic element 1 on the backside and the side edges 9. The stacking of electronic elements 1 that are so provided with a structured interconnect layer 8 is simplified in that the contact terminal pads 6 on the backside of the electronic elements 1 are surrounded by a solder stop layer which covers all regions of the backside and leaves only the contact terminal pads 6 exposed. At least one of the electronic elements can have a housing 13 with isolating external surfaces 11, and the interconnect layer 8 is then disposed on the isolating external surfaces 11 of the housing.

Electronic elements 1 constructed according to the invention can thus be stacked in any number and are not limited to a fixed number. The electronic component 1 can be installed with its bottommost element 2 on a modular PCB 25 with correspondingly arranged contact terminal pads 6. This stack can also be effectively cooled by an air cross-current, because a fixed spacing among the electronic elements 1 is maintained by the external contacts 4 of the individual electronic elements 1.

FIG. 6 is a schematic cross-section representing a sixth embodiment of the invention. Components with the same functions as in the foregoing figures are provided with the same reference characters and are not described.

The sixth embodiment of the invention differs from the foregoing embodiment in that, instead of the edge sides of the rewiring body 3 being metallized, the electrical junction or the electronic connection between the structured interconnect layer 8 on the side edges 9 of the plastic molding compound 12 of the housing to the rewiring plane of the rewiring body 3 of the electronic element 1 is achieved with the aid of feedthroughs 15 which are arranged in the edge region 16 of the rewiring body 3, which produce a connection to the rewiring plane of the rewiring body 3. This connection by way of feedthroughs in the edge region 16 of the rewiring body 3 is a very reliable connection and is better protected against damage from outside than in the fifth embodiment of the invention.

We claim:

1. An electronic component, comprising:
   electronic elements stacked on top of one another, said electronic elements including a topmost electronic element and a further electronic element disposed below said topmost electronic element;
   each of said electronic elements having side edges and each of said electronic elements including a rewiring body with external contacts distributed thereon;
   an isolating body;
   an interconnect layer disposed on said isolating body, said interconnect layer having contact terminal pads;
   said external contacts of said rewiring body of said topmost electronic element being connected to said contact terminal pads of said interconnect layer;
   said interconnect layer extending over said side edges of one of said topmost electronic element and said further electronic element;

a further interconnect layer neighboring said interconnect layer, said interconnect layer and said further interconnect layer being detachably connected to one another; and said further interconnect layer having contact terminal pads electrically connected to at least a respective further one of said electronic elements via said external contacts of said respective further one of said electronic elements.

2. The electronic component according to claim 1, wherein:

said isolating body includes a flexible plastic carrier; and said interconnect layer is disposed on said flexible plastic carrier.

3. The electronic component according to claim 1, wherein said isolating body is a self-supporting flexible isolating film.

4. The electronic component according to claim 1, wherein:

said isolating body includes a flexible isolating film; and said interconnect layer is disposed on said flexible isolating film and bent around said side edges of one of said electronic elements disposed under said flexible isolating film.

5. The electronic component according to claim 1, wherein said rewiring body is an element selected from the group consisting of a rewiring layer, a rewiring film, and a rewiring plate.

6. The electronic component according to claim 1, wherein said interconnect layer and said further interconnect layer have respective edge regions and external contact surfaces at said edge regions, said external contact surfaces are configured to be connected to contact terminal pads on a respective adjacent interconnect layer for forming a stack.

7. The electronic component according to claim 1, wherein said interconnect layer and said further interconnect layer have respective bent edge regions and respective external contact surfaces disposed on said bent edge regions.

8. The electronic component according claim 1, wherein:

said isolating body has two sides, said interconnect layer has interconnect layer portions respectively disposed on said two sides of said isolating body;

said isolating body has bent edge regions and external contact surfaces disposed at said bent edge regions;

a further isolating body is disposed below said isolating body, said further isolating body has contact terminal pads connected to said external contact surfaces of said isolating body; and respective ones of said electronic elements are provided on said two sides of said isolating body and on both sides of said further isolating body such that said electronic elements are connected to form a stacked configuration.

9. The electronic component according to claim 1, wherein:

at least one of said interconnect layer and said further interconnect layer has bent edge regions and external contact surfaces disposed at said bent edge regions; and said external contact surfaces include contact elements selected form the group consisting of contact bumps and solder balls.

10. The electronic component according to claim 1, wherein:

at least one of said interconnect layer and said further interconnect layer has bent edge regions and external contact surfaces disposed at said bent edge regions; and said external contact surfaces include a solderable coating.

11. The electronic component according to claim 1, wherein:

at least one of said interconnect layer and said further interconnect layer has bent edge regions and external contact surfaces disposed at said bent edge regions; and said external contact surfaces include a silver solder coating.

12. The electronic component according to claim 1, wherein:

said isolating body includes a flexible element selected from the group consisting of a flexible isolating film and a flexible isolating plate; and said interconnect layer is disposed on said flexible element.

13. The electronic component according to claim 1, wherein:

said isolating body includes an isolating plate with edge regions;

said interconnect layer is disposed on said isolating plate; and said isolating plate and said interconnect layer are configured to form a flexible printed circuit board for allowing said edge regions to be bent and are configured to be thermoset into a rigid printed circuit board after said edge regions are bent.

14. The electronic component according to claim 1, wherein said isolating body is an isolating layer.

15. The electronic component according to claim 1, wherein:

at least one of said electronic elements has a housing with isolating external surfaces; and said interconnect layer is disposed on said isolating external surfaces of said housing.

16. The electronic component according to claim 15, wherein said housing includes a plastic molding compound.

17. The electronic component according to claim 1, wherein at least one of said electronic components has a housing with a housing backside and housing side edges; and said isolating body and said interconnect layer are disposed on said housing backside and on said housing side edges.

18. The electronic component according to claim 1, wherein:

said rewiring body has edge regions and feedthroughs disposed in said edge regions of said rewiring body;

said interconnect layer has conductive tracks; and said feedthroughs are connected to said conductive tracks of said interconnect layer at side edges of one of said electronic elements.

* * * * *